(12) United States Patent
Pain et al.

(10) Patent No.: US 8,648,288 B2
(45) Date of Patent: Feb. 11, 2014

(54) PIXELS, IMAGERS AND RELATED FABRICATION METHODS

(75) Inventors: Bedabrata Pain, Los Angeles, CA (US); Thomas J Cunningham, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 781 days.

(21) Appl. No.: 12/727,164

(22) Filed: Mar. 18, 2010

(65) Prior Publication Data

US 2011/0226936 A1 Sep. 22, 2011

(51) Int. Cl.
*H01L 27/00* (2006.01)

(52) U.S. Cl.
USPC ............ 250/208.1; 250/214.1; 257/258; 257/291; 257/443; 257/444; 257/445; 438/22; 438/48; 438/142

(58) Field of Classification Search
USPC ............ 250/214.1, 208.1; 257/258, 290–291, 257/443–445, 461, 462; 438/22, 48, 142
See application file for complete search history.

(56) References Cited

U.S. PATENT DOCUMENTS

| | | | |
|---|---|---|---|
| 6,225,670 B1* | 5/2001 | Dierickx | 257/431 |
| 8,089,109 B2* | 1/2012 | Shinomiya | 257/292 |
| 2001/0042875 A1* | 11/2001 | Yoshida | 257/291 |
| 2001/0054726 A1* | 12/2001 | Abe | 257/292 |
| 2009/0042331 A1* | 2/2009 | Dosluoglu et al. | 438/59 |
| 2010/0140731 A1* | 6/2010 | Lee | 257/440 |

* cited by examiner

*Primary Examiner* — Seung C Sohn
*Assistant Examiner* — Kevin Wyatt
(74) *Attorney, Agent, or Firm* — Steinfl & Bruno, LLP

(57) ABSTRACT

Pixels, imagers and related fabrication methods are described. The described methods result in cross-talk reduction in imagers and related devices by generating depletion regions. The devices can also be used with electronic circuits for imaging applications.

37 Claims, 5 Drawing Sheets

US 8,648,288 B2

PIXELS, IMAGERS AND RELATED FABRICATION METHODS

STATEMENT OF GOVERNMENT GRANT

The invention described herein was made in the performance of work under a NASA contract, and is subject to the provision of public law 96-517 (35 USC202) in which the contractor has elected to retain title.

FIELD

The present disclosure relates to imagers and related devices. More in particular, it relates to pixels, imagers and related fabrication methods.

BACKGROUND

FIG. 1 shows a cross sectional view of a pixel (110) used as part of a conventional four transistor (4T) pixel architecture (100). The pixel (110) comprises a P-type conducting region (140) formed in an N-type substrate (120). A pinning n+ layer (130) is also shown in FIG. 1. A combination of the pinning layer (130), the conducting region (140) and the substrate (120) forms a conventional pinned photodiode (135), as shown by a dotted line in FIG. 1.

A shallow trench isolation region (150) (STI) is further shown in FIG. 1. The STI region (150) isolates one pixel from another. The pixel (110) comprises also a transfer gate (160) provided on top of an insulating region (170).

In operation, during an integration period when the pixel (110) is exposed to light, the transfer gate (160) is OFF and charges (in this case holes) generated within the photodiode (135) are accumulated in the conducting region (140). After the integration period, the transfer gate (160) is turned on and the charges held in the conducting region (140) are transferred to a floating node (180). The floating node (180) is electrically connected to a 3T structure (125). After charges are transferred to the floating node (180), the transfer gate (160) is turned off again and a subsequent integration period will start.

The 3T structure (125) comprises a source follower (122), a reset transistor RST (121) and a row select transistor (123). The source follower (122) converts charge to output voltage. The reset transistor (121) resets the photodiode (135) before charge is integrated and the row select transistor (123) selects a row or line for readout.

The pixel (110) as described above is an example of conventional CMOS imagers with pinned photodiodes. Such devices when implemented in deep sub-micron technology, suffer from both reduced charge handling capacity and increased electrical cross-talk due to operation from a reduced power supply. The reduced voltage operation limits the maximum internal field and hence reduced depletion width. Both of these are responsible for increased cross-talk and limited charge handling capacity. For small pixels, lateral depletion cannot be extended due to the structure of the imager and therefore more lateral carrier diffusion due to thermal gradients, will result. The problem is more accentuated for a back-illuminated CMOS imager where the photo-generated carriers have to travel across the entire thickness of the device. In this case, there is a higher likelihood that the charges generated within the imager diffuse laterally and this results in a worse inter-pixel cross-talk.

SUMMARY

According to a first aspect, a pixel is provided, comprising: a first semiconductor layer of a first conductivity type; a second semiconductor layer of the first conductivity type, formed on the first semiconductor layer; a third semiconductor layer of a second conductivity type that is opposite to the first conductivity type, formed on the second semiconductor layer; a fourth semiconductor layer of the first conductivity type formed on the third semiconductor layer having a first depth from a pixel front side; and a charge collection region of the second conductivity type formed within the third semiconductor layer and the fourth semiconductor layer and extending vertically to a second depth from the pixel front side.

According to a second aspect, an imager is provided, comprising: a first semiconductor layer of a first conductivity side; a second semiconductor layer of the first conductivity type, deposited on the first semiconductor layer; a third semiconductor layer of a second conductivity type that is opposite to the first conductivity type deposited on the second semiconductor layer; a fourth semiconductor layer of the first conductivity type formed on the third semiconductor layer having a first depth from a pixel front side; a charge collection region of the second conductivity type formed inside the third semiconductor layer and the fourth semiconductor layer extending vertically to a first depth from the imager front side; an insulating region formed above an imager front side; a transfer gate formed above the insulating region; and a floating region of the second conductivity type formed under the imager front side and inside the fourth semiconductor layer.

According to a third aspect, a method of carrier generation in a pixel is provided, comprising: providing a first semiconductor layer of a first conductivity type; providing a second semiconductor layer of the first conductivity type; providing a third semiconductor layer of a second conductivity type that is opposite to the first conductivity type; providing a fourth semiconductor layer of the first conductivity type having a first depth from an imager front side; forming the second semiconductor layer on the first semiconductor layer; forming the third semiconductor layer on the second semiconductor layer; forming the fourth semiconductor layer on the third semiconductor layer; forming a charge collection region of the second conductivity type inside the third semiconductor layer and the fourth semiconductor layer, the charge collection region extending vertically to a second depth from the imager front side; illuminating the pixel from either the back side or the front side; applying a first voltage level to the front side; and applying a second voltage level to the back side in such a way that all areas under the semiconductor region and the charge blocking region are depleted.

Further aspects of the present disclosure are shown in the description, drawings and claims of the present application.

DETAILED DESCRIPTION

In what follows, methods for reducing cross-talk in imagers and related devices will be described.

Figure 1:
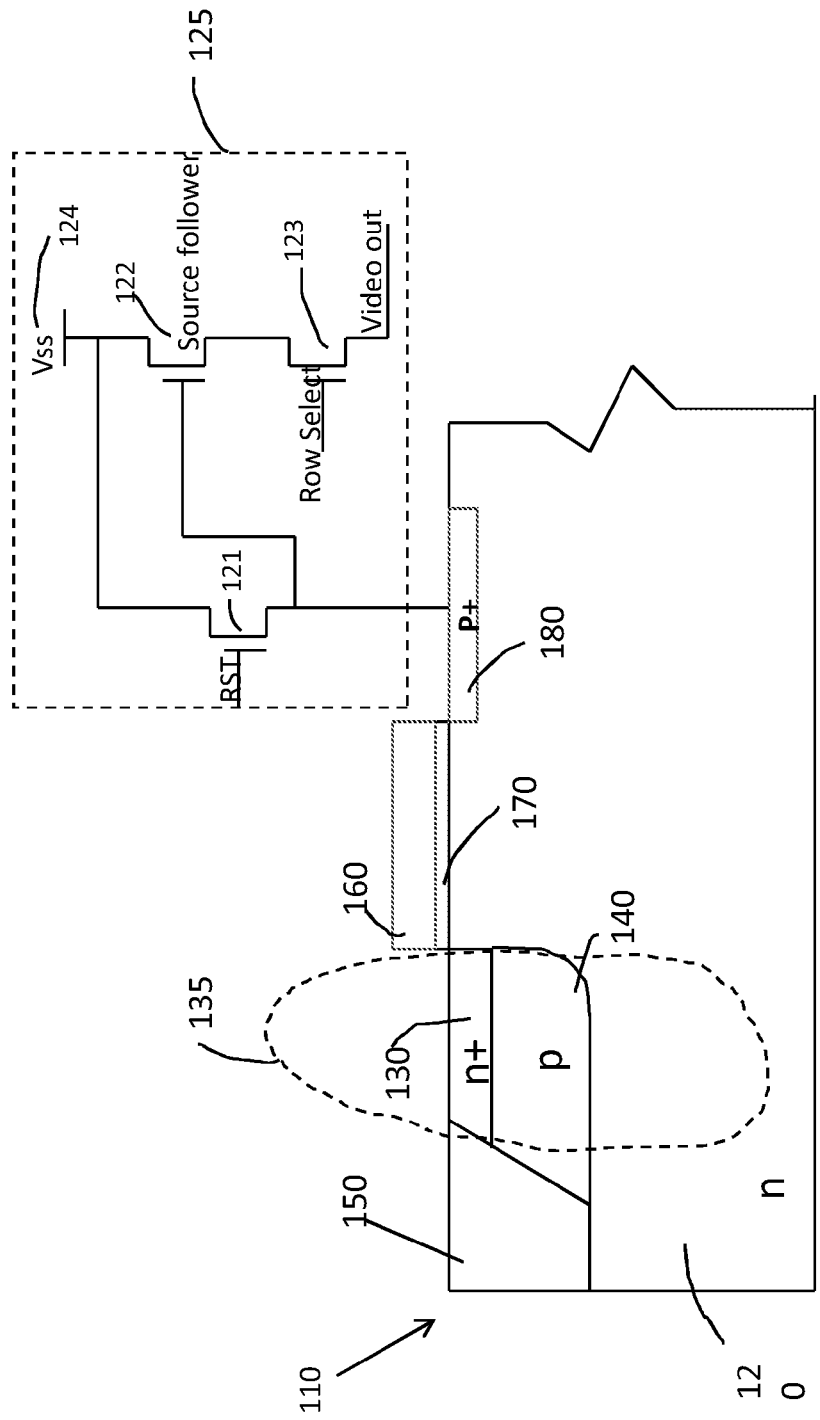
FIG. 1 shows a schematic partial cross sectional view of a known pixel architecture.
Figure 2:
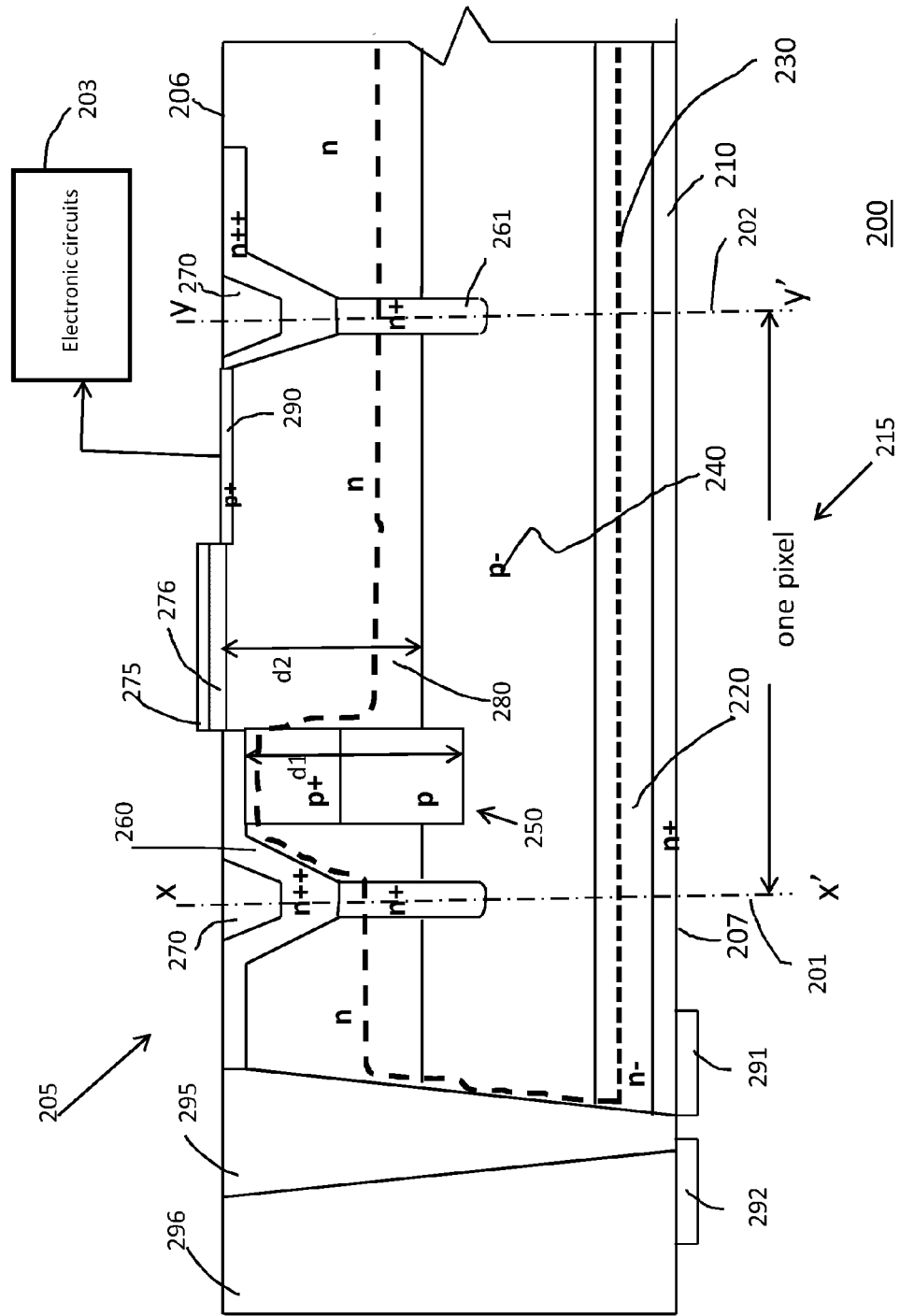
FIGS. 2 and 3 show a schematic partial cross sectional view according to embodiments of the present disclosure.

FIG. 2 shows a cross sectional view of a device (200) comprising an imager (205) in accordance with an embodiment of the disclosure, connectable, in operation, to an electronic circuit block (203). Two vertical lines XX' (201) and YY' (202) are shown in FIG. 2. The imager (205) comprises a pixel (215). The pixel (215) is a portion of the imager (205) lying between the two vertical lines (201, 202) as shown in FIG. 2.

The electronic circuit block (203) comprises electronic circuits (e.g., conventional 3T, 5T structures, digital/analog circuits, etc.). The imager (205) comprises a first semiconductor layer (210) of a first conductivity type (e.g., N), a second semiconductor layer (220) of the first conductivity type (e.g., N) and a third semiconductor layer (240) of a second conductivity type (e.g., P) opposite to the first conductivity type. The first semiconductor layer (210) has a back side (207) and the third semiconductor layer (240) has a front side (206). As shown in FIG. 2, the second semiconductor layer (220) is formed on top of the first semiconductor layer (210) and the third semiconductor layer (240) is formed on top of on the second semiconductor layer (220). A fourth semiconductor layer (280) of the same type as the first semiconductor layer is formed on top of the third semiconductor layer (240) by, for example, ion-implantation or by means of epitaxial growth. The person skilled in the art will understand that the layers may be built by means of epitaxial growth and/or by ion-implantation. One may build the structure top down (280, then 240, then 220, and then 210) or bottom up, or a combination thereof.

As further shown in FIG. 2, the imager (205) further comprises a charge collection region (250) of the second conductivity type (e.g., P). The charge collection region (250) is formed within the third semiconductor layer (240) and the fourth semiconductor layer (280) (e.g., by way of implanting) extending vertically to a first depth d1 as shown in FIG. 2. According to an embodiment of the disclosure, the charge collection region is formed by using two implants, a heavier p+ near the surface, and a lighter p that is deeper. A shallow trench isolation (STI) region (270) is also shown in FIG. 2. The STI region (270) is used to isolate pixels (215) from one another.

According to an embodiment of the disclosure, the imager (205) further comprises a first semiconductor region (260) and a second semiconductor region (261) of the first conductivity type (e.g., N). The first semiconductor region (260) and the second semiconductor region (261) are formed within the fourth semiconductor layer (280) and underneath the front side (206) overlying the charge collection region (250). As shown in FIG. 2, the semiconductor region (260) surrounds the STI region (270). The semiconductor region (261) is a vertical implant located at a perimeter of the pixel (215), providing pixel to pixel isolation.

FIG. 2 also shows an insulating region (276) provided on the front side (206) adjacent to the semiconductor region (260). A transfer gate (275) is also shown in FIG. 2. The transfer gate (275) is formed on the insulating region (276).

With continued reference to FIG. 2, according to an embodiment of the disclosure, the fourth semiconductor layer (280) a vertical depth of d2 from the front side (206). As shown in FIG. 2, according to an embodiment of the disclosure, d2 is larger than d1.

Further shown in FIG. 2, is a floating region (290) of the second conductivity type (e.g., P). The floating region (290) is formed underneath the front side (206) and within the charge blocking region (280) in accordance with an embodiment of the present disclosure.

According to an embodiment of the disclosure, also shown in FIG. 2, the imager (205) further comprises a deep trench isolation region (295) which isolates an electronics section (296) from rest of the imager (205). The deep trench isolation region (295) borders the entire imaging array, and not each pixel. The person skilled in the art will understand that the electronic section (296) can include, for example, digital and analog circuits requiring completely different biasing conditions than those of the rest of the imager (205).

A first metal contact (292) and a second metal contact (291) are also shown in FIG. 2. The first metal contact (292) and the second metal contact (291) provide bias contacts respectively for the electronic section (296) and the rest of the imager (205). The person skilled in the art will appreciate that the deep trench isolation region (295) will provide both thermal and electrical isolation of the electronics section (296) from the rest of the imager (205). Also, by keeping the first metal contact (292) separate from the second metal contact (291), different bias voltages can be applied to the electronics section (296) and the rest of the imager (205). In this way, the electronic section (296) can be biased based on requirements of any conventional technology used to fabricate the electronics section (296) and at the same time, a different bias voltage resulting in a better performance of the imager (205) can be used to bias the rest of the imager (205). In addition, this arrangement makes the device (200) impervious to substrate noise and ground bounce resulting from a high speed operation and intermittent current fluctuations in the electronic section (296).

According to an embodiment of the disclosure, the imager (205) is configured to be illuminated from the bottom side (207). However, the person skilled in the art will understand that other variations of the imager (205) will allow illumination from the front side (206).

According to an embodiment of the disclosure, also shown in FIG. 2, doping concentrations of the second semiconductor layer (220) and the third semiconductor layer (240) are chosen such that a depleted region (230) is formed when proper bias voltages are applied to the front side (206) and the bottom side (207). As a result, the front side (206) and bottom side (207) becomes electrically isolated, therefore, biases applied to the front side (206) and the adjacent transfer gate (275) can be completely different from that applied to the bottom side (207). As an example, while CMOS-compatible voltages (e.g., 3V) is applied to the front side (206) and the transfer gate (275), the bottom side (207) can be biased to a much larger voltage (e.g. 5V) applied via the second metal contact (291), resulting in the depleted region (230). It is understood that, depletion results in collection of carriers (holes in the case of the embodiment shown in FIG. 2) under the influence of an electric field, causing the carriers to travel vertically rather than laterally. As a result, cross-talk is significantly reduced. Simultaneously, depletion also increases the charge storage volume, and hence the charge handling capacity. According to an embodiment of the disclosure, once the depleted region (230) is generated by applying proper bias voltages, a further increase in the bias voltage applied to the bottom side (207) will result in more degree of depletion and as a result, further improvement in cross-talk can be achieved. The person skilled in the art will appreciate that the depleted region (230) is obtained by virtue of the third semiconductor layer (240).

According to an embodiment of the disclosure, as also explained later, during operation, the fourth semiconductor layer (280) will experience a higher potential than the charge collection region (250). Therefore, generated carriers (holes in case of the embodiment shown in FIG. 2), will be channeled more efficiently towards the collection region (250) which has a lower potential. Consequently, less lateral charge drift will occur and as a result, cross-talk will further improve.

In what follows, plots of doping concentrations and potential profile of different points within the imager (205) are explained in accordance with the present disclosure.

Figure 3:
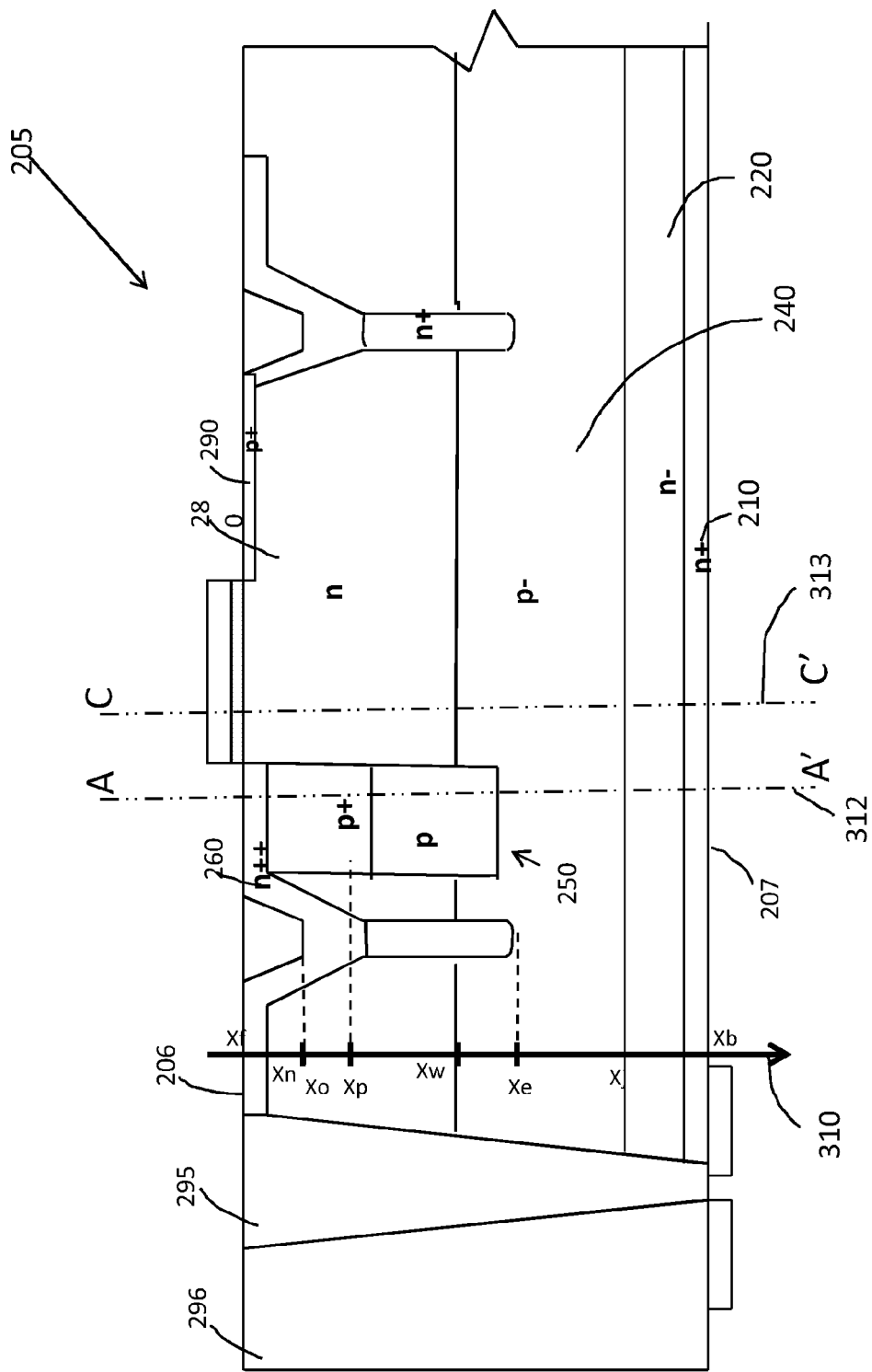
Figure 4:
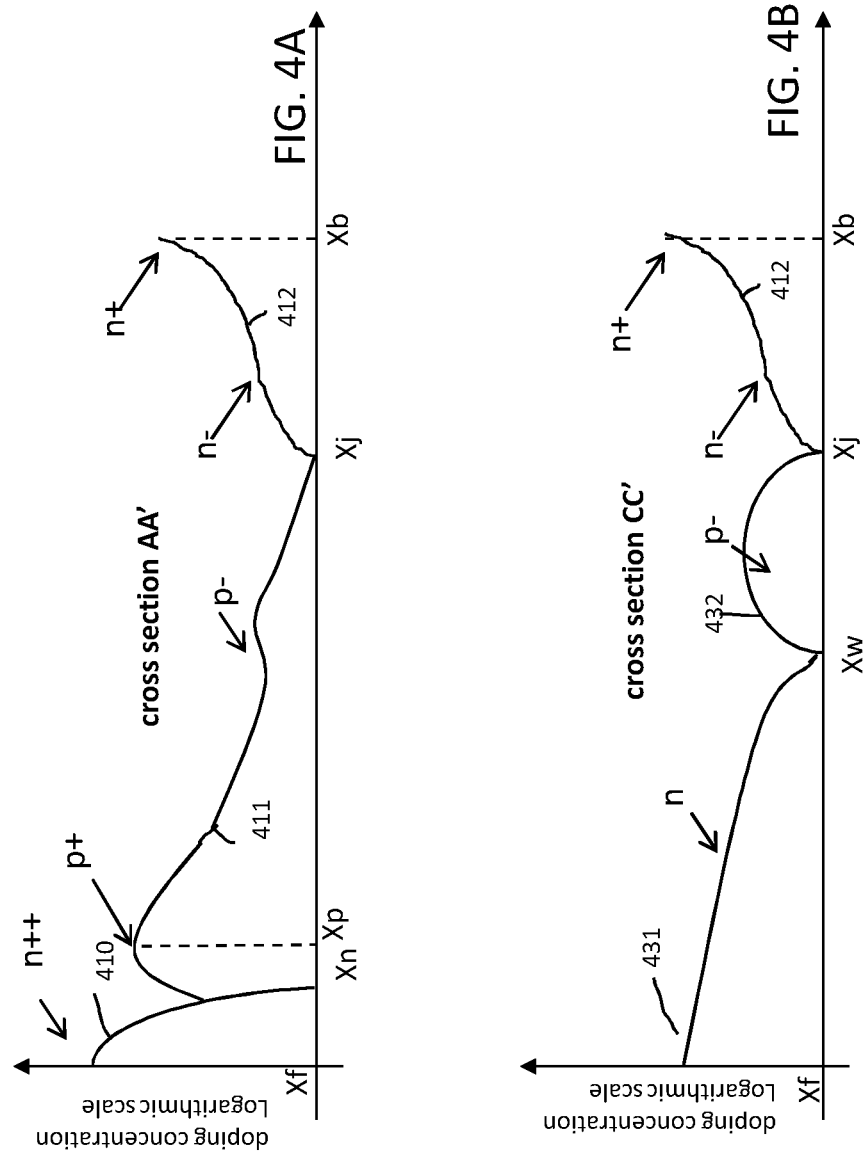
FIGS. 4A-4B shows representations of doping profiles along different sections of the device of FIG. 3.

For the sake of clarity, the cross sectional view of the imager (205) as shown in FIG. 2 is also shown in FIG. 3. A vertical axis (310) is shown in FIG. 3. The vertical axis (310) is pointing downward and is used to represent coordinates of different points within the imager (205) and along two cross sections, AA' (312), and CC'(313). As can be seen in FIG. 3, the front side (206) has a coordinate Xf on the vertical axis (310) and the bottom side (207) has a coordinate Xb on the vertical axis (310 FIG. 4A shows a representation of doping profiles along the cross section AA' (312) according to an embodiment of the disclosure. A first profile (410), a second profile (411) and a third profile (412) are shown in FIG. 4A.

The first profile (410) represents doping concentration in the semiconductor region (260) underneath the front side (206). According to an embodiment of the disclosure, the semiconductor region (260) is highly doped (e.g., $10^{18}$ 1/cm$^3$). The region (261) is lower doped (e.g. $10^{16}$1/cm$^3$).

The second profile (411) has a peak corresponding to the charge collection region (250) having a high doping concentration (e.g., $10^{17}$ to $10^{18}$ 1/cm$^3$). As a result of the high doping concentration, as described later, the charge collection region (260) will experience a lowest potential level during the integration period, and consequently, generated carriers (holes in this case) will be efficiently collected in the charge collection region (260).

The third profile (412) represents doping profiles of the first semiconductor layer (210) and the second semiconductor layer (220). Examples for doping profiles n+ and n– as shown in FIG. 4A are respectively $10^{16}$ to $10^{18}$ and $10^{14}$ to $10^{16}$ 1/cm$^3$.

FIG. 4B shows a graphic representation of doping profiles along the cross section CC' (313) according to an embodiment of the disclosure. A fourth profile (431) is shown in FIG. 4B. The fourth profile (431) represents a doping profile of the blocking region (280) having a doping concentration n. An example for the doping concentration n is $10^{15}$ to $10^{16}$ 1/cm$^3$. A fifth profile (432) is also shown in FIG. 4B. The fifth profile (432) represents a doping profile within the third semiconductor layer (240) having a doping concentration of p– as shown in FIG. 4B.

In accordance with an embodiment of the present disclosure, the fourth semiconductor layer (280) is biased to a maximum analog voltage (e.g. 3V). With the transfer gate (275) off, a surface potential under the transfer gate (275) is at or above 3V, and a minimum potential is achieved at the point $x_p$ of FIG. 3, within the charge collection region (250). As a result, all photo-generated carriers (holes in this case) are collected in and around this point during an integration or an exposure period.

In order to read out the photogenerated carriers, the transfer gate (275) is momentarily pulsed down to a lower voltage (e.g. 0V). As a result, all collected carriers (holes in this case) within the charge collection region (250) are drained of the floating region (290) which has the lowest voltage level (e.g., 0V).

Figure 5:
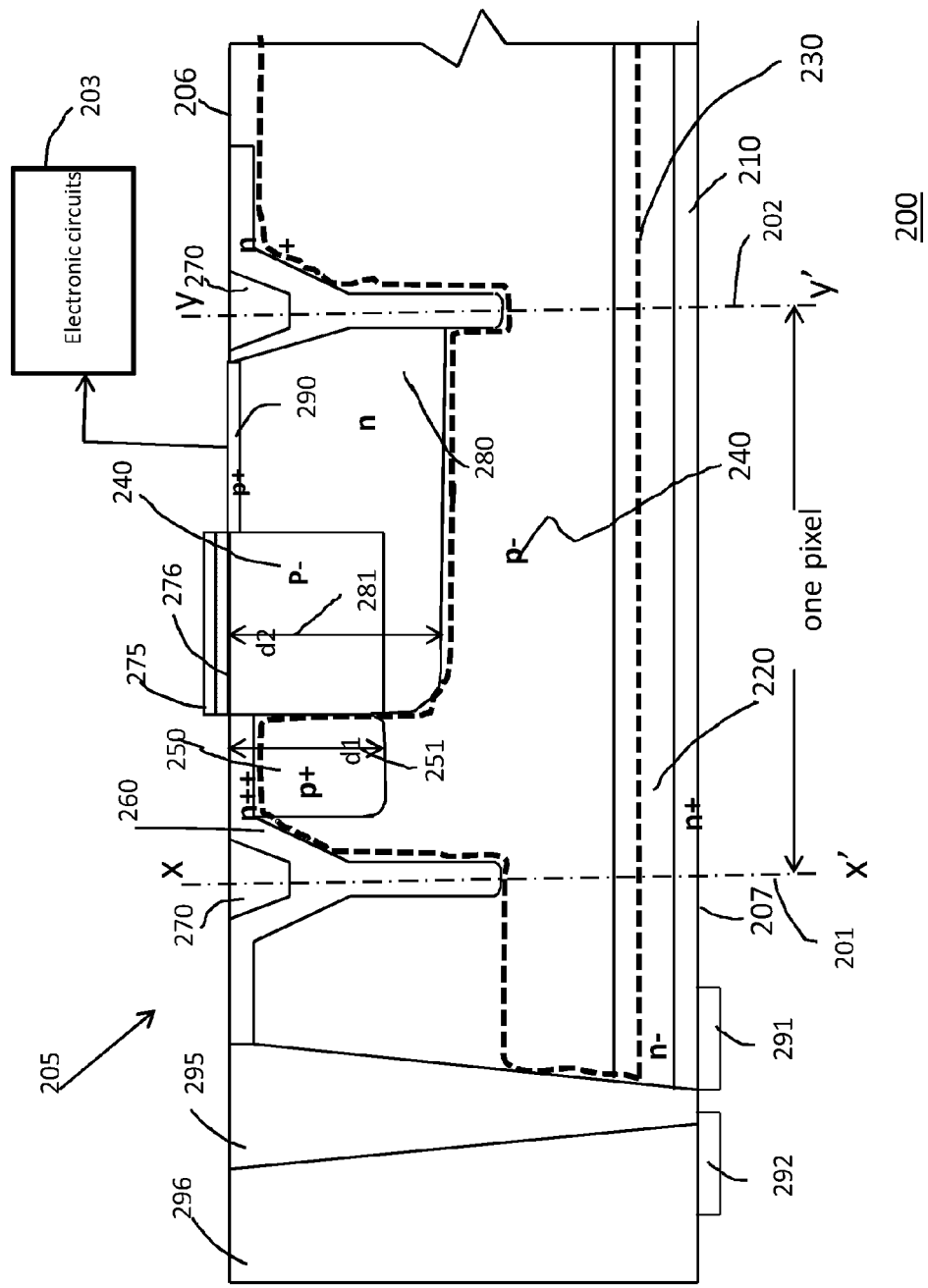
FIG. 5 shows voltage levels corresponding to regions inside the device of FIG. 3.

FIG. 5 shows the device (200) as shown in FIG. 2 with a slight modification resulting in a further embodiment of the present disclosure. As can be seen in FIG. 5, only a portion of blocking region (280) is laterally extended up to the charge collection region (250) as opposed to the embodiment shown in FIG. 2 where the charge blocking region is fully (280) is fully extended laterally up to the charge collection region (250).

The present disclosure has shown pixels, imagers and related fabrication methods. While the methods and devices have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A pixel comprising:
a first semiconductor layer of a first conductivity type;
a second semiconductor layer of the first conductivity type, formed on the first semiconductor layer;
a third semiconductor layer of a second conductivity type that is opposite to the first conductivity type, formed on the second semiconductor layer;
a fourth semiconductor layer of the first conductivity type formed on the third semiconductor layer having a first depth from a pixel front side; and
a charge collection region of the second conductivity type formed within the third semiconductor layer and the fourth semiconductor layer and extending vertically to a second depth from the pixel front side, wherein the second depth is deeper than the first depth.

2. The pixel of claim 1, further comprising:
a first shallow trench isolation (STI) region formed under the pixel front side and beside a pixel first lateral side; and
a second STI region formed under the pixel front side and beside a pixel second lateral side.

3. The pixel of claim 1 wherein the pixel front side is adapted to be illuminated in an operative condition of the pixel.

4. A pixel comprising:
a first semiconductor layer of a first conductivity type;
a second semiconductor layer of the first conductivity type, formed on the first semiconductor layer;
a third semiconductor layer of a second conductivity type that is opposite to the first conductivity type, formed on the second semiconductor layer;
a fourth semiconductor layer of the first conductivity type formed on the third semiconductor layer having a first depth from a pixel front side;
a charge collection region of the second conductivity type formed within the third semiconductor layer and the fourth semiconductor layer and extending vertically to a second depth from the pixel front side;
a first shallow trench isolation (STI) region formed under the pixel front side and beside a pixel first lateral side;
a second STI region formed under the pixel front side and beside a pixel second lateral side;
a first semiconductor region of the first conductivity type formed under the pixel front side, the first semiconductor region overlying the charge collection region, extending into the fourth semiconductor layer and surrounding a first STI region side wall and a first STI region bottom side; and
a second semiconductor region of the first conductivity type, formed under the pixel front side, extending into the fourth semiconductor layer and surrounding a second STI region side wall and a second STI region bottom side.

5. The pixel of claim 4, wherein each of the first semiconductor region and the second semiconductor region comprises an additional region of the first conductivity type, the additional regions extending vertically into the third semiconductor layer and the fourth semiconductor layer.

6. The pixel of claim 5, wherein the additional regions have lighter dopings than the respective first semiconductor region and the second semiconductor region.

7. The pixel of claim 4 wherein the first semiconductor layer, the second semiconductor layer, the third semiconductor layer, the charge collection region, the fourth semiconductor layer, the first semiconductor region and the second semiconductor region are respectively of (n+, n−, p−, p+, n, n++, and n+) type or (p+, p−, n−, n+, p, p++, and p+) type.

8. The pixel of claim 4 wherein: the first semiconductor layer, the second semiconductor layer, the third semiconductor layer, the charge collection region, the fourth semiconductor layer, the first semiconductor region and the second semiconductor region have respective doping concentrations of ($10^{16}$ to $10^{17}$, $10^{14}$ to $10^{15}$, $10^{14}$ to $10^{15}$, $10^{17}$ to $10^{18}$, $10^{17}$ to $10^{18}$, $10^{18}$, $10^{18}$ 1/cm$^3$).

9. A pixel comprising:
a first semiconductor layer of a first conductivity type;
a second semiconductor layer of the first conductivity type, formed on the first semiconductor layer;
a third semiconductor layer of a second conductivity type that is opposite to the first conductivity type, formed on the second semiconductor layer;
a fourth semiconductor layer of the first conductivity type formed on the third semiconductor layer having a first depth from a pixel front side; and
a charge collection region of the second conductivity type formed within the third semiconductor layer and the fourth semiconductor layer and extending vertically to a second depth from the pixel front side, wherein the charge collection region is formed by using a first implant and a second implant below the first implant, the second implant having a lighter doping than that of the first implant.

10. A pixel comprising:
a first semiconductor layer of a first conductivity type;
a second semiconductor layer of the first conductivity type, formed on the first semiconductor layer;
a third semiconductor layer of a second conductivity type that is opposite to the first conductivity type, formed on the second semiconductor layer;
a fourth semiconductor layer of the first conductivity type formed on the third semiconductor layer having a first depth from a pixel front side; and
a charge collection region of the second conductivity type formed within the third semiconductor layer and the fourth semiconductor layer and extending vertically to a second depth from the pixel front side; and
a pixel back side, wherein the pixel back side is adapted to be illuminated in an operative condition of the pixel.

11. An imager comprising:
a first semiconductor layer of a first conductivity side;
a second semiconductor layer of the first conductivity type, deposited on the first semiconductor layer;
a third semiconductor layer of a second conductivity type that is opposite to the first conductivity type deposited on the second semiconductor layer;
a fourth semiconductor layer of the first conductivity type formed on the third semiconductor layer having a first depth from a pixel front side;
a charge collection region of the second conductivity type formed inside the third semiconductor layer and the fourth semiconductor layer extending vertically to a second depth from an imager front side;
an insulating region formed above the imager front side;

a transfer gate formed above the insulating region; and
a floating region of the second conductivity type formed under the imager front side and inside the fourth semiconductor layer.

12. The imager of claim 11, further comprising:
a first shallow trench isolation (STI) region formed under the imager front side and beside an imager first lateral side; and
a second STI region formed under the imager front side and beside an imager second lateral side.

13. The imager of claim 12, wherein a first semiconductor region of the first conductivity type is formed under the pixel front side, the first semiconductor region overlying the charge collection region, extending into the fourth semiconductor layer and surrounding a first STI region side wall and a first STI region bottom side.

14. The imager of claim 13, further comprising a second semiconductor region of the first conductivity type, wherein each of the first semiconductor region and the second semiconductor region comprises an additional region of the first conductivity type, the additional regions extending vertically into the third semiconductor layer and the fourth semiconductor layer.

15. The imager of claim 14, wherein the additional regions have lighter dopings than the respective first semiconductor region and the second semiconductor region.

16. The imager of claim 13 wherein: the first semiconductor layer, the second semiconductor layer, the third semiconductor layer, the charge collection region, the fourth semiconductor layer, the first semiconductor region and the second semiconductor region are respectively of (n+, n−, p−, p+, n, n++, and n+) type or (p+, p−, n−, n+, p, p++, and p+) type.

17. The imager of claim 13 wherein the first semiconductor layer, the second semiconductor layer, the third semiconductor layer, the charge collection region, a charge blocking region, the first semiconductor region and a second semiconductor region have respective doping concentrations of ($10^{18}$ to $10^{17}$, $10^{14}$ to $10^{15}$, $10^{14}$ to $10^{15}$, $10^{17}$ to $10^{18}$, $10^{17}$ to $10^{18}$, $10^{18}$, $10^{18}$ 1/cm$^3$).

18. The imager of claim 11, wherein the charge collection region is formed by using a first implant and a second implant below the first implant, the second implant having a lighter doping than that of the first implant.

19. The imager of claim 11 wherein the second depth is deeper than the first depth.

20. The imager of claim 11 wherein the imager front side is adapted to be illuminated in an operative condition of the imager.

21. The imager of claim 11 wherein an imager back side is adapted to be illuminated in an operative condition of the imager.

22. The imager of claim 11 further comprising an electronics region vertically isolated by a deep trench isolation region.

23. The imager of claim 22 wherein the deep trench isolation region is extended vertically from the imager front side up to an imager back side.

24. The imager of claim 22 wherein the electronic region comprises digital and analog circuits.

25. The imager of claim 22 wherein a first metal contact is provided on the imager back side isolated from a second metal contact provided on an electronics region bottom side.

26. The imager of claim 11 wherein the imager is part of a CMOS image sensor.

27. The imager of claim 11 wherein the imager is part of a CCD image sensor.

28. The imager of claim 11 wherein: the imager is part of a 3T, 4T, 5T, 6T, or 7T architecture.

29. A method of carrier generation in a pixel comprising:
providing a first semiconductor layer of a first conductivity type;
providing a second semiconductor layer of the first conductivity type;
providing a third semiconductor layer of a second conductivity type that is opposite to the first conductivity type;
providing a fourth semiconductor layer of the first conductivity type having a first depth from an imager front side;
forming the second semiconductor layer on the first semiconductor layer;
forming the third semiconductor layer on the second semiconductor layer;
forming the fourth semiconductor layer on the third semiconductor layer;
forming a charge collection region of the second conductivity type inside the third semiconductor layer and the fourth semiconductor layer, the charge collection region extending vertically to a second depth from the imager front side;
illuminating the pixel from either an imager back side or the imager front side;
applying a first voltage level to the front side; and
applying a second voltage level to the back side in such a way that a semiconductor region in correspondence of a width of the pixel is depleted.

30. The method of claim 29 wherein the second depth is deeper than the first depth.

31. The method of claim 29, further comprising:
forming a semiconductor region of the first conductivity type under the pixel front side, the semiconductor region overlying the charge collection region and extending vertically into the fourth semiconductor layer.

32. The method of claim 31, wherein the first semiconductor layer, the second semiconductor layer, the third semiconductor layer, the charge collection region, and the first semiconductor region are respectively of (n+, n−, p−, p+, and n++) type.

33. The method of claim 31, wherein the first semiconductor layer, the second semiconductor layer, the third semiconductor layer, the charge collection region, the fourth semiconductor layer and the first semiconductor region have respective doping concentrations of ($10^{16}$ to $10^{17}$, $10^{14}$ to $10^{15}$, $10^{14}$ to $10^{15}$, $10^{17}$ to $10^{18}$, $10^{17}$ to $10^{18}$, $10^{18}$, $10^{18}$ $1/cm^3$).

34. The method of claim 31, wherein the first semiconductor layer, the second semiconductor layer, the third semiconductor layer, the charge collection region, a fourth semiconductor region and a first semiconductor region are respectively of (n+, n−, p−, p+, n, and n++) type.

35. The method of claim 29, wherein: the second voltage level is larger than the first voltage level.

36. The method of claim 29, wherein the first voltage level is 3V, the second voltage level is 5V and the pixel is illuminated from the back side.

37. The method of claim 29, further comprising forming a charge blocking region within the fourth semiconductor layer, wherein said second voltage level is applied in such a way that also all areas under the charge blocking region are depleted.

* * * * *